(12) United States Patent
Eissler et al.

(10) Patent No.: US 8,399,893 B2
(45) Date of Patent: Mar. 19, 2013

(54) LUMINOUS MEANS

(75) Inventors: Dieter Eissler, Qing Pu Shanghai (DE);
Siegfried Herrmann, Neukirchen (DE)

(73) Assignee: OSRAM Opto Semiconductors GmbH (DE)

( * ) Notice: Subject to any disclaimer, the term of this patent is extended or adjusted under 35 U.S.C. 154(b) by 297 days.

(21) Appl. No.: 12/992,230

(22) PCT Filed: Aug. 7, 2009

(86) PCT No.: PCT/DE2009/001122
§ 371 (c)(1),
(2), (4) Date: Dec. 6, 2010

(87) PCT Pub. No.: WO2010/031367
PCT Pub. Date: Mar. 25, 2010

(65) Prior Publication Data
US 2011/0114975 A1     May 19, 2011

(30) Foreign Application Priority Data
Sep. 17, 2008  (DE) .......................... 10 2008 047 579

(51) Int. Cl.
*H01L 33/00*  (2010.01)
(52) U.S. Cl. .............. 257/89; 257/E27.12; 257/E33.067
(58) Field of Classification Search .................. 257/89, 257/E27.12, E33.067
See application file for complete search history.

(56) References Cited

U.S. PATENT DOCUMENTS

| | | | |
|---|---|---|---|
| 2006/0102912 A1* | 5/2006 | Abe et al. ......................... | 257/88 |
| 2006/0145169 A1* | 7/2006 | Wang et al. ...................... | 257/89 |
| 2007/0018189 A1 | 1/2007 | Chin et al. | |
| 2007/0177648 A1 | 8/2007 | Tanaka | |
| 2008/0217630 A1 | 9/2008 | Plank | |
| 2009/0173961 A1 | 7/2009 | Windisch et al. | |
| 2010/0072500 A1 | 3/2010 | Herrmann | |
| 2010/0103650 A1 | 4/2010 | Herrmann et al. | |

FOREIGN PATENT DOCUMENTS

| | | |
|---|---|---|
| DE | 10 2007 004 304 | 1/2007 |
| DE | 10 2006 039 369 | 7/2007 |
| DE | 10 2007 010 755 | 10/2008 |
| DE | 10 2007 062 042 | 6/2009 |
| EP | 1 641 043 A1 | 3/2006 |
| EP | 1 968 115 | 2/2008 |
| JP | 08-274376 | 10/1996 |
| JP | 2000-244020 * | 9/2000 |
| JP | 2007-115928 A | 5/2007 |
| WO | 97/23912 | 7/1997 |
| WO | 2005/081319 | 2/2005 |
| WO | 2006/054236 A2 | 5/2006 |
| WO | 2008/038915 | 4/2008 |
| WO | 2008/056292 | 5/2008 |

* cited by examiner

*Primary Examiner* — David S Blum
(74) *Attorney, Agent, or Firm* — DLA Piper LLP (US)

(57) ABSTRACT

A luminous means includes a first group of semiconductor chips and a second group of semiconductor chips, each group includes at least one semiconductor chip, wherein the first and second groups of semiconductor chips are arranged laterally alongside one another at least in part with respect to a main emission direction of the luminous means, and a third group of semiconductor chips which includes at least one semiconductor chip and is disposed downstream of the first and the second group with respect to the main emission direction, wherein each group of semiconductor chips emits electromagnetic radiation in wavelength ranges that differ from one another in pairs, radiation emitted by the third group of semiconductor chips has the shortest-wave wavelength range, radiation emitted by the first and second group of semiconductor chips at least partly passes into the at least one semiconductor chip of the third group, and mixed radiation is emitted by an emission area of the luminous means.

15 Claims, 7 Drawing Sheets

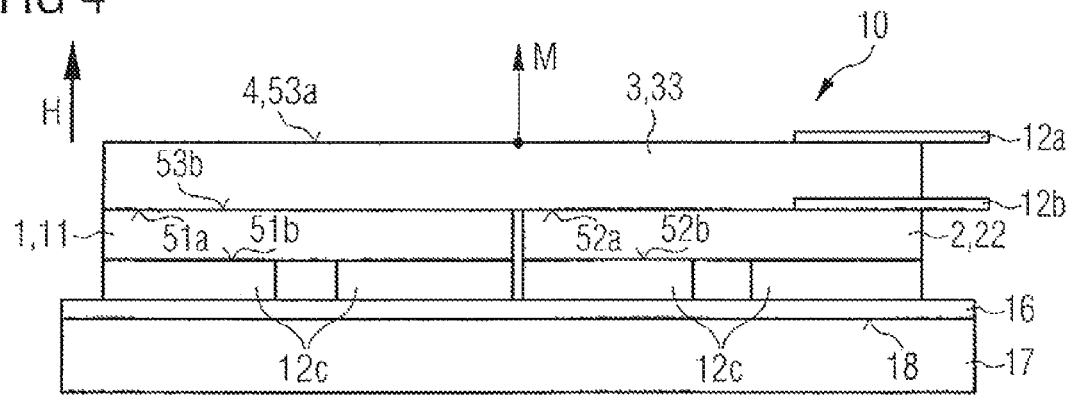
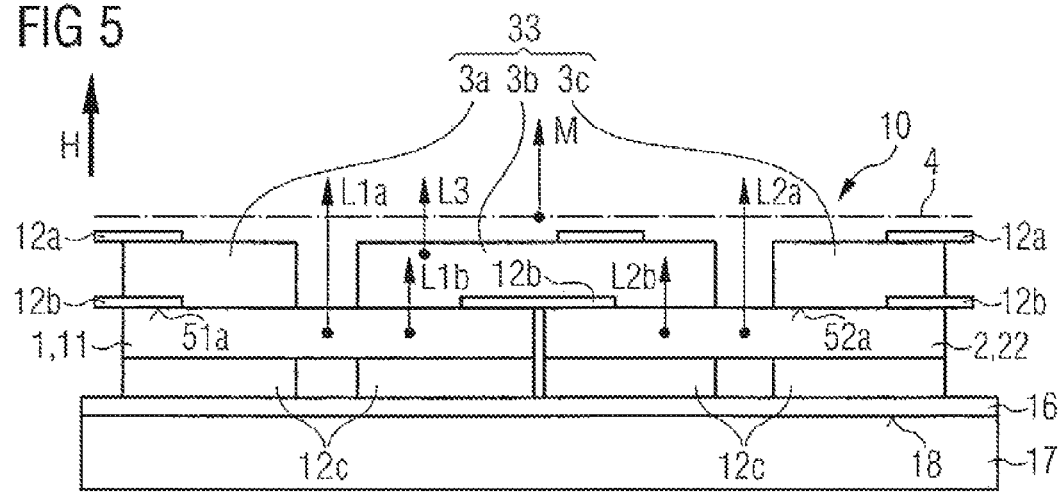
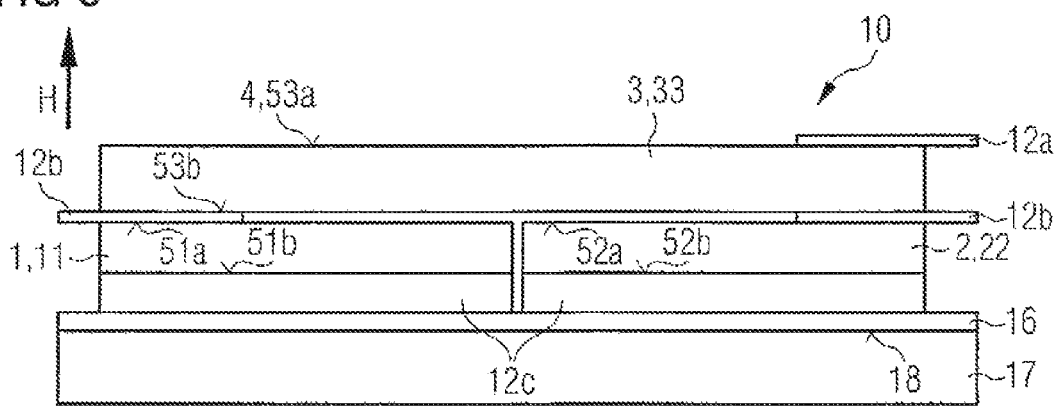

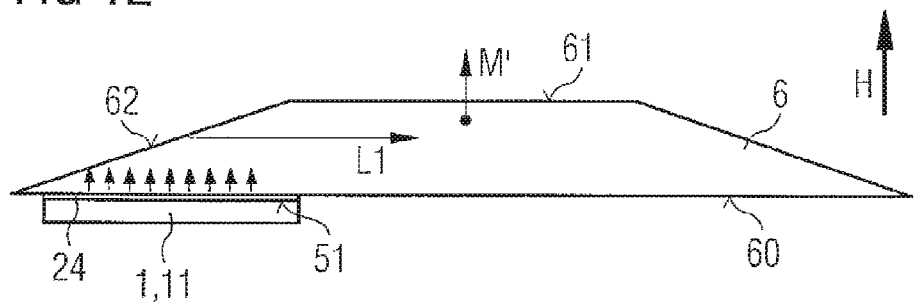
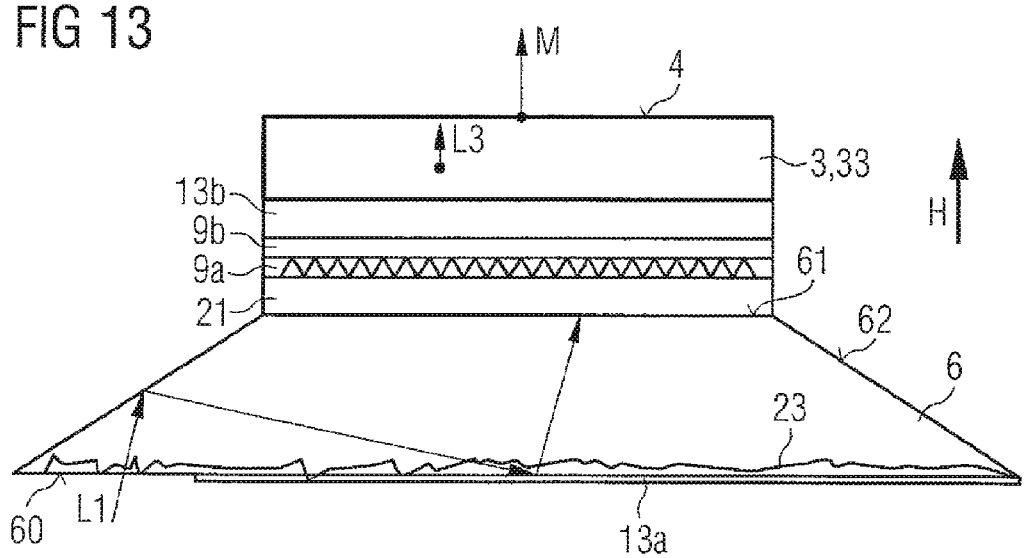

LUMINOUS MEANS

RELATED APPLICATIONS

This is a §371 of International Application No. PCT/DE2009/001122, with an international filing date of Aug. 7, 2009, which is based on German Patent Application No. 10 2008 047 579.3, filed Sep. 17, 2008, the subject matter of which is incorporated by reference.

TECHNICAL FIELD

This disclosure relates to a luminous means and methods for making such luminous means.

BACKGROUND

Optoelectronic components such as light-emitting or laser diodes, for example, have found wide technical application. Some aspects that have fostered the spread of such components include, for instance, their high efficiency and durability against external loads and ambient influences. Moreover, optoelectronic components have a long lifetime. Optoelectronic components are often based on semiconductor chips which emit radiation in a specific, usually narrow, spectral range.

It could therefore be helpful to provide a luminous means which exhibits homogeneous emission with respect to intensity and color.

SUMMARY

We provide a luminous means including a first group of semiconductor chips and a second group of semiconductor chips, each group including at least one semiconductor chip, wherein the first and second groups of semiconductor chips are arranged laterally alongside one another at least in part with respect to a main emission direction of the luminous means, and a third group of semiconductor chips which includes at least one semiconductor chip and is disposed downstream of the first and the second group with respect to the main emission direction, wherein each group of semiconductor chips emits electromagnetic radiation in wavelength ranges that differ from one another in pairs, radiation emitted by the third group of semiconductor chips has the shortest-wave wavelength range, radiation emitted by the first and second group of semiconductor chips at least partly passes into the at least one semiconductor chip of the third group, and mixed radiation is emitted by an emission area of the luminous means.

BRIEF DESCRIPTION OF THE DRAWINGS

FIGS. 4 to 11 show schematic illustrations of arrangements of semiconductor chips of further examples of luminous means.

FIGS. 12 to 15 show schematic illustrations of further examples of luminous means with at least one optical element.

DETAILED DESCRIPTION

Figure 1:
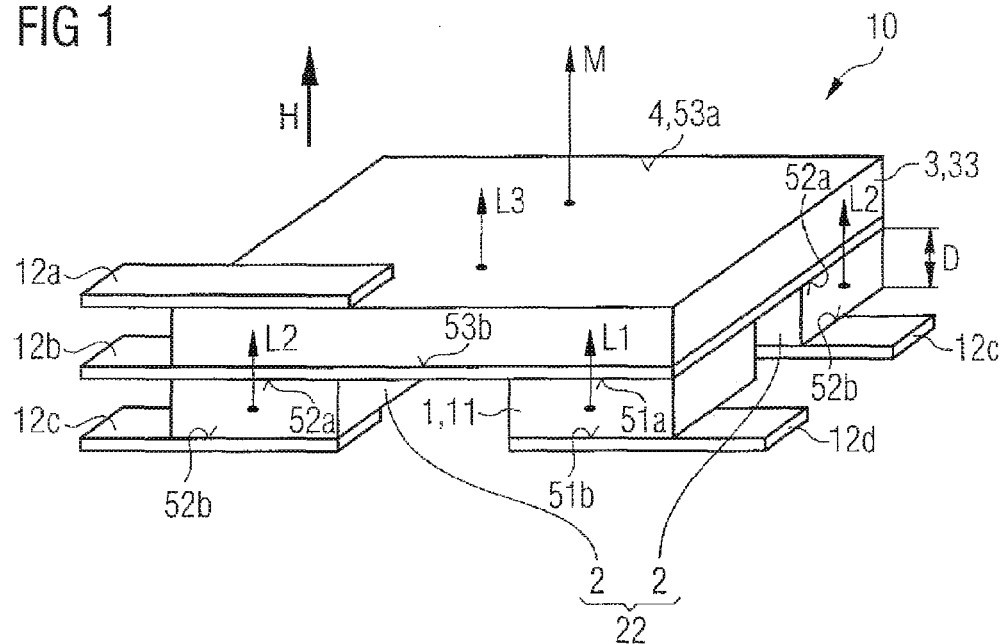
FIG. 1 shows a schematic three-dimensional illustration of an example of a luminous means.

The luminous means can have a first group of semiconductor chips. The group comprises at least one semiconductor chip, preferably a plurality of semiconductor chips. The semiconductor chips are configured to emit electromagnetic radiation, in particular in the visible spectral range, during operation.

The luminous means may comprise a second group of semiconductor chips which has at least one semiconductor chip, preferably a plurality of semiconductor chips. The semiconductor chips of the second group are also configured to emit electromagnetic radiation, in particular in the visible spectral range, during operation.

The luminous means may have at least one main emission direction. By way of example, the main emission direction is that direction in which the luminous means emits the highest radiation power. If the luminous means is configured in areal and/or planar fashion, then the main emission direction is preferably oriented perpendicularly to a surface of the luminous means. In particular, the main emission direction is oriented parallel to a growth direction of an epitaxial layer sequence, for instance of a semiconductor chip of the luminous means. The luminous means can also have two main emission directions pointing in opposite directions.

At least one portion of the semiconductor chips of the second group may be arranged laterally alongside semiconductor chips of the first group with respect to the main emission direction. By way of example, the semiconductor chips of the first group and of the second group are arranged in a plane, in particular perpendicularly to the main emission direction. The semiconductor chips of the first and of the second group can be applied on a single mounting area, which is fashioned as planar, in particular.

The luminous means may comprise a third group of semiconductor chips, wherein the group comprises at least one semiconductor chip, in particular a plurality of semiconductor chips. The semiconductor chips of the third group are likewise configured for emitting electromagnetic radiation, preferably in the blue spectral range.

The semiconductor chips of the third group may be disposed downstream of the semiconductor chips of the first and of the second group at least in part, preferably completely, with respect to the main emission direction. In other words, the main emission direction predefines a direction, and the semiconductor chips of the third group follow those of the first and second group along this direction. By way of example, the semiconductor chips of the third group are arranged vertically above the semiconductor chips of the first and of the second group.

The semiconductor chips of each group may be configured for emitting in wavelength ranges that differ from one another in pairs.

Radiation emitted by the third group of semiconductor chips may be radiation which has the shortest-wave wavelength range. By way of example, the semiconductor chips of the first group emit in the red spectral range, the semiconductor chips of the second group emit in the green spectral range and the semiconductor chips of the third group emit in the blue spectral range.

Radiation emitted by the semiconductor chips of the first and of the second group may at least partly pass into at least one semiconductor chip of the third group. In other words, the semiconductor chips of the third group, at least partly, are optically disposed downstream of the semiconductor chips of the first and of the second group. That is to say, that at least one portion of the radiation generated by the semiconductor chips of the first and of the second group radiates through the at least one semiconductor chip of the third group.

The luminous means may have an emission area by which a mixed radiation is emitted. Preferably, the mixed radiation is white light.

The luminous means may have a first group of semiconductor chips and a second group of semiconductor chips, wherein the groups each comprise at least one semiconductor chip and the first and the second group of semiconductor chips are arranged laterally alongside one another at least in part with respect to a main emission direction of the luminous means. Furthermore, the luminous means comprises a third group of semiconductor chips, which comprises at least one semiconductor chip, and wherein the third group is disposed downstream of the first and of the second group with respect to the main emission direction. Each group of semiconductor chips is configured for emitting electromagnetic radiation, in particular in the visible spectral range, in wavelength ranges that differ from one another in pairs. In this case, the radiation emitted by the third group of semiconductor chips has the shortest-wave wavelength range. The radiation emitted by the first and second group of semiconductor chips at least partly passes into the at least one semiconductor chip of the third group. A mixed radiation is emitted via an emission area of the luminous means.

Such a luminous means can emit a homogeneous mixed radiation with respect to intensity and color. This is ensured, inter alia, by virtue of the fact that the radiation emitted by the first and second group of semiconductor chips, in the at least one semiconductor chip of the third group, mixes with the radiation of said semiconductor chip.

The different semiconductor chips of the individual groups may not be monolithically integrated. In other words, the semiconductor chips of the first, second and third group are produced separately in pairs. The semiconductor chips which emit in different spectral ranges are not grown directly on one another, for example. In the luminous means, therefore, a plurality of separately produced semiconductor chips are joined together or arranged to form an arrangement.

A main area of at least one semiconductor chip of the third group may be larger than a main area of at least one semiconductor chip of the first and of at least one semiconductor chip of the second group. A main area is, for instance, such an area which bounds a semiconductor chip in a direction parallel to an epitaxial growth direction. A main area preferably constitutes a radiation exit area of a semiconductor chip. The at least one semiconductor chip of the third group has, in particular a main area that is larger than a main area of all the semiconductor chips of the first and of the second group. The at least one semiconductor chip of the third group can completely cover the semiconductor chips of the first and second group in the direction of the main emission direction. That is to say, that if the main areas of the semiconductor chips are projected onto a plane perpendicular to the main emission direction, then the projected main areas of the at least one semiconductor chip of the third group completely encompasses the projected main areas of the semiconductor chips of the first and of the second group.

The main areas of all the semiconductor chips may be oriented perpendicularly to the main emission direction. The main emission direction therefore forms a normal, with respect to the main areas of the semiconductor chips.

The third group may comprise precisely one semiconductor chip, the main area of which is larger than the sum of the main areas of all the semiconductor chips of the first and second group. Moreover, the semiconductor chip of the third group can completely cover all the other semiconductor chips.

At least one semiconductor chip may have a thickness that is less than or equal to 20 μm. Preferably, the thickness of at least one semiconductor chip is less than or equal to 15 μm, in particular less than or equal to 10 μm. Preferably, at least the semiconductor chips of one group, in particular all the semiconductor chips of all the groups of the luminous means have such a thickness. The semiconductor chips can be shaped for example as thin-film chips, as described in WO 2005/081319 A1, or as substrateless thin-film chips, as specified in DE 10 2007 004 304 A1. The subject matter of both publications with regard to the semiconductor chips described therein and with regard to the production methods described therein is incorporated herein by reference.

Each group of semiconductor chips may be electrically driveable individually. Since the individual groups emit in different colors, for example, the color or the chromaticity coordinate of the mixed radiation emitted by the luminous means can be set over a wide range.

The semiconductor chips may be individually driveable. That is to say, that each semiconductor chip can be electrically energized independently of the other semiconductor chips. By way of example, the semiconductor chips are electrically connected in parallel. If, in particular, the first group and second group have a multiplicity of semiconductor chips, then such an electrical interconnection of the semiconductor chips makes it possible for the mixed radiation emitted by the luminous means also to be set in a targeted manner in specific partial regions of the luminous means.

The luminous means may have an optical element arranged optically between the semiconductor chips of the first and second group and the semiconductor chips of the third group. In other words, at least partly, radiation emitted by the semiconductor chips of the first and second group passes through and/or via the optical element to the third group. The optical element can have a refractive and/or reflective effect and can be fashioned as a solid body. Preferably, the optical element has an effect of total reflection, at least in places. The optical element reflects, in particular at boundary areas oriented parallel or at an acute angle with respect to the main emission direction.

The optical element may be shaped like a prism or like a truncated pyramid. It is likewise possible for the optical element to be shaped like a truncated cone. A luminous means comprising such an optical element can be constructed in a particularly space-saving manner in a direction parallel to the main emission direction.

The height of the optical element in the direction of the main emission direction may be very much smaller than the width of the optical element in a direction perpendicular to the main emission direction. Preferably, the ratio of width to height is greater than 100, in particular greater than 1000. By using such an optical element it is possible to construct a luminous means which emits over a large area and is very flat in this case.

The semiconductor chips of the first and second groups may be at least partly fitted directly to the optical element. If the optical element is shaped like a truncated pyramid or like a truncated cone, then the semiconductor chips of the first and of the second group are preferably situated at a base-forming area of the optical element, that is to say, for example, at the largest, continuous area of the optical element.

At least one semiconductor chip of the first group and at least one semiconductor chip of the second group may be fashioned as a flip-chip. That is to say that the electrical contacts of the semiconductor chips are situated on a single main area. Moreover, at least one semiconductor chip of the third group is fashioned such that its electrical contacts are situated on main areas that lie opposite one another.

When the third group comprises at least two semiconductor chips, the semiconductor chips may be spaced apart from one another in the direction of the main emission direction. These semiconductor chips spaced apart from one another span two planes, perpendicularly to the main emission direction. These planes define an interspace situated between the planes. The semiconductor chips of the first and of the second group are arranged in said interspace.

The luminous means may be configured to emit the mixed radiation at emission areas of the luminous means that lie opposite one another. In other words, the luminous means emits the mixed radiation at two sides that lie opposite one another. The luminous means therefore has two main emission directions pointing in opposite directions. In the case of such a luminous means, the semiconductor chips of the first and second group are situated between the semiconductor chips of the third group, for example. A luminous means which emits radiation on both sides can therefore be realized.

The semiconductor chips of the first and second groups, as viewed in the main emission direction, may not be covered by the semiconductor chips of the third group. That is to say that the semiconductor chips of the first and second group are laterally offset with respect to the semiconductor chips of the third group.

A portion of radiation emitted by the first group and the second group may not pass through the semiconductor chips of the third group before leaving the luminous means. A portion of the radiation emitted by the first and second group is therefore guided laterally past the semiconductor chips of the third group. In particular, a portion of the radiation which leaves the luminous means via the emission area thereof does not pass through the semiconductor chips of the third group. The power proportion of the radiation emitted by the semiconductor chips of the first and second group which is guided past the semiconductor chips of the third group is preferably between 1% and 25%, in particular between 5% and 15%. This widens a range of the adjustable chromaticity coordinate in the CIE standard chromaticity diagram of the mixed radiation emitted by the luminous means, particularly in the green and red.

When the first and the second group each comprise at least two semiconductor chips, at least one semiconductor chip of the first group and at least one semiconductor chip of the second group may be arranged one above another with respect to the main emission direction. In other words, with respect to the main emission direction, one of the semiconductor chips of one group covers a semiconductor chip of the other group. The overlapping semiconductor chips can be in direct contact with one another. With such an arrangement it is possible to obtain particularly homogeneous emission of the mixed radiation since the radiation generated by the semiconductor chips of the first and second group is already mixed, at least in part, in the semiconductor chips and, consequently, a comparatively homogeneous radiation passes to the at least one semiconductor chip of the third group.

At least one semiconductor chip may have prism-like microstructures. Preferably, all the semiconductor chips of the first and of the second group have such structures. The prism-like structures are preferably applied to precisely one main area of the semiconductor chip. Radiation emitted by the semiconductor chip is deflected at the microstructures, at least partly, for example, by total reflection such that a main emission direction of the semiconductor chip, in a manner governed by the microstructures, can lie in a direction parallel to the main side of the semiconductor chip. The microstructures can be produced with a semiconductor material or with a dielectric which is applied in a layer on the semiconductor chip.

A chromaticity coordinate of mixed radiation emitted locally at the emission area in the CIE standard chromaticity diagram may deviate by at most 0.02 from an average value of the chromaticity coordinate of the mixed radiation, averaged over the entire emission area. Preferably, the deviation is at most 0.01. Deviation should be understood to mean the root of the sum of the squares of the x- and y-deviations of the chromaticity coordinates from one another in the CIE standard chromaticity diagram. In this case, the lateral extent of the emission area is preferably greater than 1 cm, in particular greater than 10 cm.

The homogenous emission of mixed radiation over the entire emission area is achieved, inter alia, by radiation emitted by the semiconductor chips of the first and second group passing through the semiconductor chips of the third group, at least in part. As a result of this, efficient color mixing also takes place within the semiconductor chips of the third group. Homogeneity of the mixed radiation is therefore also already ensured directly at the emission area which can be formed by a main area of the semiconductor chips of the third group. If, in contrast to the description here, semiconductor chips which emit in different colors are arranged laterally alongside one another, then mixing to form white light, for example, takes place only at a certain distance from the radiation-emitting areas of the semiconductor chips. Consequently, homogeneous emission cannot be obtained close to the semiconductor chips.

The luminous means may be fashioned in a mechanically flexible manner and a bending radius of less than or equal to 5 cm is possible. The mechanical flexibility can be realized, in particular, by use of substrateless thin-film semiconductor chips. By virtue of the small thickness of such components, only small material-internal mechanical stresses occur in the event of moderate bending. By virtue of the layered construction, that is to say by virtue of the fact that the semiconductor chips of the third group are disposed downstream of the semiconductor chips of the first and second groups with respect to the main emission direction, mechanical strains can likewise be minimized in the event of bending. This holds true particularly if the optical element situated between the semiconductor chips of the first and second group and the at least one semiconductor chip of the third group is fashioned with a mechanically flexible film or foil.

The optical element may be fashioned with a plastic and/or glass film or foil. In other words, the optical element consists of such a film or foil or contains a film or foil of this type.

The size of the emission area may be at least 1 cm$^2$, preferably at least 10 cm$^2$, in particular at least 500 cm$^2$. A luminous means of this type can be used for backlighting displays, for example.

The optical element may be provided with a reflective layer in places at an element underside of the optical element that is remote from the emission area, at least in places. The emission efficiency of the luminous means can be increased by a reflective layer at the optical element.

At least one prism film or foil may be fitted between the at least one semiconductor chip of the third group and the optical element.

Some fields of application in which luminous means described here can be used are, for instance, backlighting of displays or indicating devices. Furthermore, the luminous means described here can also be used, for instance, in illumination devices for projection purposes, in headlights or light emitters or in general lighting.

A luminous means described here will be explained in greater detail below on the basis of examples with reference to the drawings. In this case, identical reference symbols indicate identical elements in the individual figures. Relationships to scale are not illustrated in this case. However, individual elements may be illustrated with an exaggerated size to afford a better understanding.

Turning now to the drawings, FIG. 1 illustrates an example of a luminous means 10. A semiconductor chip 1 of a first group 11 has two main sides 51a, 51b lying opposite one another. An electrical connection 12d is fitted to the main side 51b, which is remote from a semiconductor chip 3 of a third group 33, the electrical connection having a reflective effect for a radiation L1 emitted during the operation of the semiconductor chip 1. Radiation L1 encompasses a wavelength range in the red spectral range.

Two semiconductor chips 2 of the second group 22 are arranged analogously to the semiconductor chip 1 of the first group 11 and have two main sides 52a, 52b lying opposite one another, wherein electrical connections 12c are fitted to the main sides 52b, said electrical connections having a reflective effect for radiation L2 emitted by the semiconductor chips 2 during operation. Radiation L2 includes a wavelength range in the green spectral range. Radiation L1, L2 emitted by the semiconductor chips 1, 2 is symbolized by arrow lines. Radiation L1, L2 leaves the semiconductor chips 1, 2 through the main areas 51a, 52a facing the semiconductor chip 3 of the third group 33.

An emission area 4 of the luminous means 10 is formed by a main area 53a of the semiconductor chip 3 of the third group 33. An electrical connection 12b is fitted over a large area at a main side 53b of the semiconductor chip 3 lying opposite the emission area 4. The electrical connection 12b is formed with a transparent conductive oxide, TCO for short. The semiconductor chips 1, 2 of the first 11 and second group 22 are mechanically, electrically and optically connected to the semiconductor chip 3 of the third group 33 by the electrical connection 12b. Electrical contact is furthermore made with the semiconductor chip 3 of the third group 33 via an electrical connection 12a at the main side 53a. The electrical connection 12b can have a transmissive effect for radiation L1, L2 of the semiconductor chips 1, 2 and a reflective effect for radiation L3 of the semiconductor chip 3. Radiation L3 generated by the semiconductor chip 3 has a wavelength range in the blue spectral range.

Radiation L1, L2 of the first group 11 and of the second group 22 mixes in the semiconductor chip 3 of the third group 33 to form a mixed radiation M, which leaves the luminous means 10 via the emission area 4. Consequently, a main emission direction H of the luminous means 10 is oriented perpendicularly to the emission area 4 or to the main area 53a. The main emission direction H is symbolized by a thick arrow in the illustration. Main emission directions of radiations L1, L2, L3 are oriented parallel to the main emission direction H of the luminous means 10.

The semiconductor chip 3 of the third group 33 covers all the other semiconductor chips 1, 2. The main areas 51a, 51b, 52a, 52b, 53a, 53b of the semiconductor chips 1, 2, 3 are arranged parallel to one another and, within the scope of the production tolerances, are oriented perpendicularly to the main emission direction H. Within the scope of the production tolerances, the semiconductor chips 1, 2, 3 have a thickness D of approximately 6 μm. All the semiconductor chips 1, 2, 3 are electrically driveable individually. As a result of this, by way of example, the color of the mixed radiation M is variable or adjustable during operation of the luminous means 10.

Figure 2:
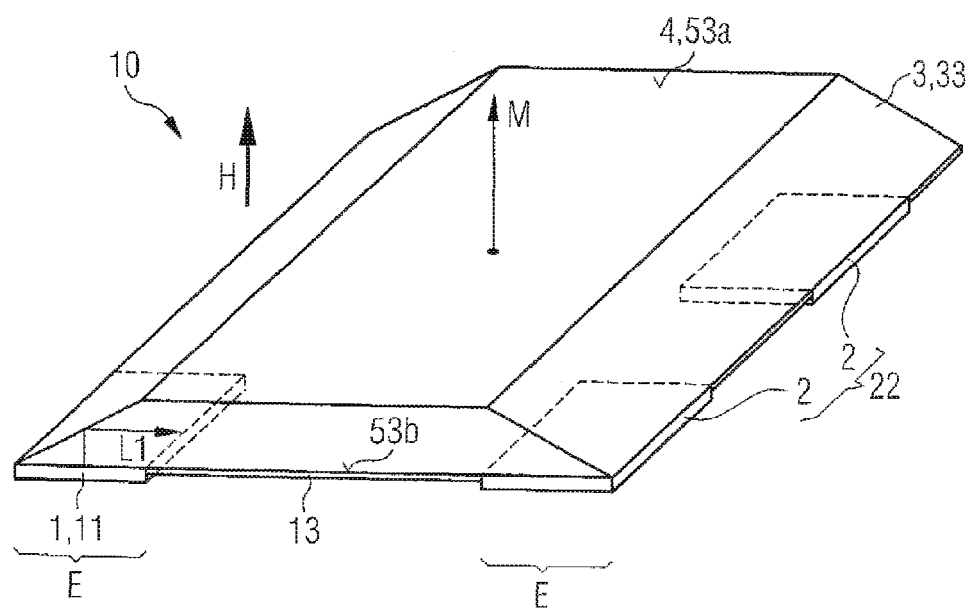
FIG. 2 shows a schematic three-dimensional illustration of a further example of a luminous means with an optical element.

A further example of a luminous means 10 is illustrated in FIG. 2. The main area 53a of the semiconductor chip 3 of the third group 33 is smaller than the main area 53b. As a result, the semiconductor chip 3 of the third group 33 has an edge region E in which side areas of the semiconductor chip 3 are beveled. The semiconductor chips 1, 2 of the first 11 and second group 22 are fitted to the main area 53b in said edge region E. With the oblique side areas, radiation L1, L2 emitted by the semiconductor chips 1, 2 is deflected in a lateral direction perpendicularly to the main emission direction H. As a result, radiations L1, L2, L3 are efficiently mixed to form the mixed radiation M in the semiconductor chip 3. The main area 53a also forms the emission area 4 of the luminous means 10. A reflective layer 13 is fitted to partial regions of the main area 53b which are not in contact with the semiconductor chips 1, 2 of the first 11 and second group 22, which reflective layer makes it possible to increase the coupling-out of light via the emission area 4.

An example of semiconductor chips 1, 2 in particular of the first group 11 and of the second group 22 is shown in FIG. 3. The semiconductor chip 1 has a p-conducting layer 14 and an n-conducting layer 15. A pn junction is formed in a region in which the layers 14, 15 meet one another. Radiation L1 to be emitted by the semiconductor chip 1 is generated in this region during operation.

The electrical connection 12d is situated at the main side 51b and the electrical connection 12b is situated at the main side 51a. A microstructure 8 comprising a dielectric material is applied at that side of the connection 12b which is remote from the layers 14, 15. The microstructure 8 has a prism-like structure as shown in FIG. 3B. By the areas of the microstructure 8 which are arranged obliquely with respect to the main area 51a, radiation L1 generated by the semiconductor chip 1 is deflected, for example, by total reflection. The angle of the obliquely arranged area with respect to the main area 51a is preferably in the range of between 30° and 60°, in particular approximately 45°. At least in part, radiation L1 runs in a direction parallel to the main area 51a and thus perpendicular to the main emission direction H. Together with microstructure 8, the semiconductor chip 1 has a thickness of approximately 18 μm.

The microstructure 8 has a structure size of approximately 12 μm. The structure size is thus distinctly larger than the wavelength of radiation L1 that is emitted by the semiconductor chip 1. By way of example, the occurrence of diffraction effects can be reduced as a result of this. To improve the coupling-out efficiency of radiation L1 from the semiconductor chip 1, the connection 12d is configured as reflective for the radiation L1, and the connection 12b has a transmissive effect with regard to radiation L1.

Figure 3A:
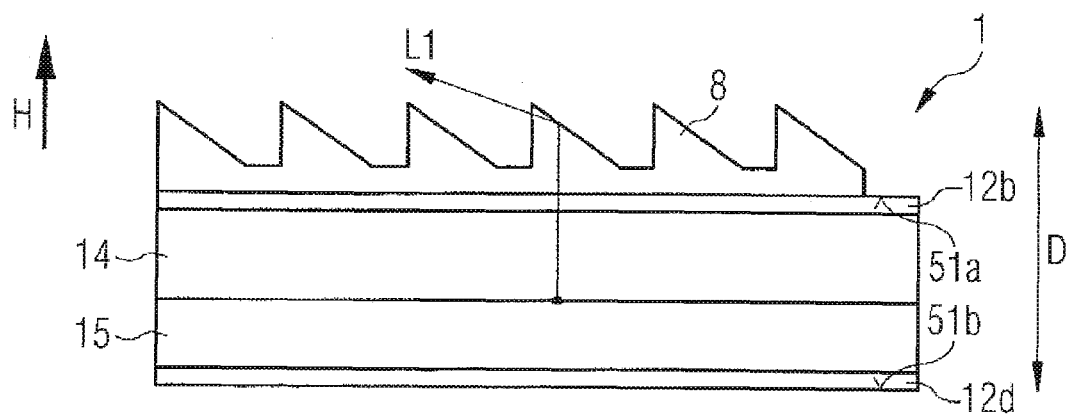
FIG. 3 shows a schematic side view (A) and a schematic three-dimensional illustration (B) of an example of a semiconductor chip with a microstructuring.
Figure 3B:
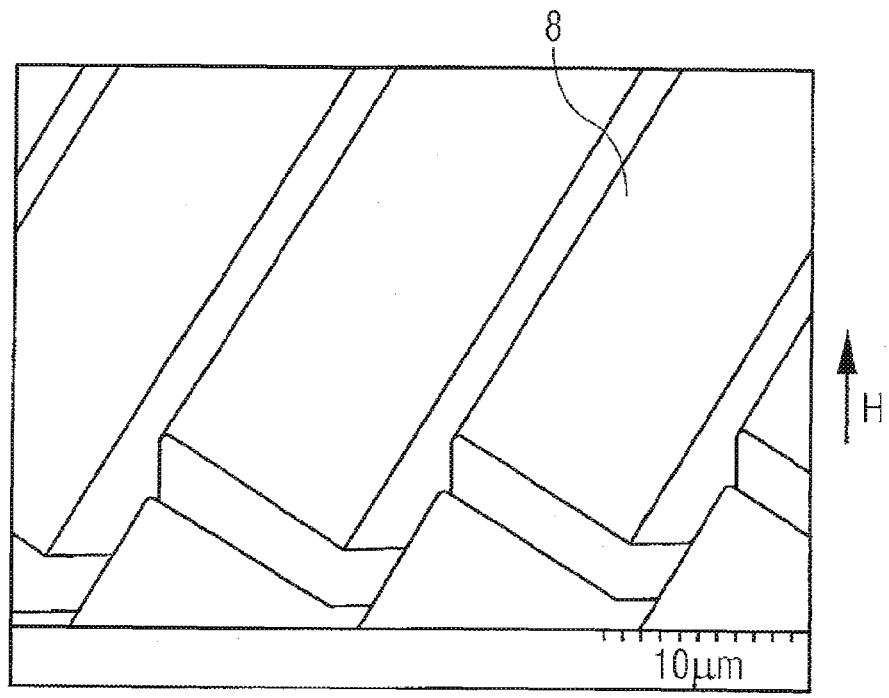

A semiconductor chip in accordance with FIGS. 3A, 3B can be used in the example in accordance with FIG. 2, for example, to obtain efficient mixing of radiations L1, L2, L3 in the semiconductor chip 3 of the third group 33.

Various arrangements of semiconductor chips 1, 2, 3 are illustrated on the basis of various examples of luminous means 10 in FIGS. 4 to 12.

In the example of the luminous means 10 in accordance with FIG. 4, conductor tracks 16 are fitted to a carrier top side 18 of a carrier 17. The carrier 17 has a high thermal conductivity of preferably at least 50 W/(mK). A thickness of the carrier 17 is between 50 μm and 300 μm, for example. The carrier 17 can be fashioned with a metal, a ceramic, a semiconductor material, a glass or a plastic.

Via the electrical connections 12c, electrical contact is made with the semiconductor chips 1, 2 of the first 11 and second group 22, the semiconductor chips being configured as flip-chips. The semiconductor chip 3 of the third group 33 has separate electrical connections 12a, 12b. As a result, the semiconductor chips 1, 2, 3 are individually electrically driveable and energizable.

The semiconductor chip 3 completely covers both semiconductor chips 1, 2 and terminates flush with the semiconductor chips 1, 2 in a direction perpendicular to the main emission direction H. The semiconductor chip 3 is fashioned with a material that effects scattering with respect to the wavelength of radiations L1, L2 such that efficient mixing of radiations L1, L2, L3 takes place in the semiconductor chip 3.

If the semiconductor chips 1, 2, 3 are fashioned as thin-film chips having a thickness of less than 20 μm, then all the semiconductor chips 1, 2, 3, that is to say including the semiconductor chip 3, are situated very close to the carrier 17. Efficient dissipation of the heat that arises during the operation of the semiconductor chips 1, 2, 3 via the carrier 17 is possible as a result. The electrical connections 12c are preferably configured in large-area fashion, as are the conductor tracks 16 formed with a metal. The thermal resistance, in particular from the semiconductor chip 3 toward the carrier 17 is reduced as a result of this.

In the example of the luminous means 10 in accordance with FIG. 5, a plurality of semiconductor chips 3 are disposed downstream of the semiconductor chips 1, 2 of the first 11 and of the second group 22 with respect to the main emission direction H. Both radiation L1 of the semiconductor chip 1 and radiation L2 of the semiconductor chip 2 are coupled into the—in a lateral direction—central semiconductor chip 3 of the third group 33. Partial radiation L1a, L2a is not guided into the semiconductor chips 3, but rather leaves the luminous means 10 directly through the emission area 4 which is symbolized by a dash-dotted line. As a result, it is possible to set the color of the mixed radiation M in a large range of the CIE standard chromaticity diagram.

In the example in accordance with FIG. 5, the semiconductor chips 1, 2 are fashioned as flip-chips. In the example in accordance with FIG. 6 all the semiconductor chips 1, 2, 3 are fashioned such that the electrical connections 12a, 12b, 12c lie at the main sides 51a, 51b, 52a, 52b, 53a, 53b lying opposite one another, thus resulting in a parallel-like electrical interconnection. The connections 12b are grounded, for example. Via the conductor tracks 16 and the connection 12a, the semiconductor chips 1, 2, 3 can be electrically driven separately.

Optionally, dielectric interlayers (not illustrated) can also be fitted between the semiconductor chips 1, 2 and the semiconductor chip 3, which interlayers can serve for further light scattering of radiation L1, L2. Moreover, simplified electrical contact-connection is possible by such dielectric interlayers in the case of a multiplicity of semiconductor chips 1, 2, 3.

Figure 7:
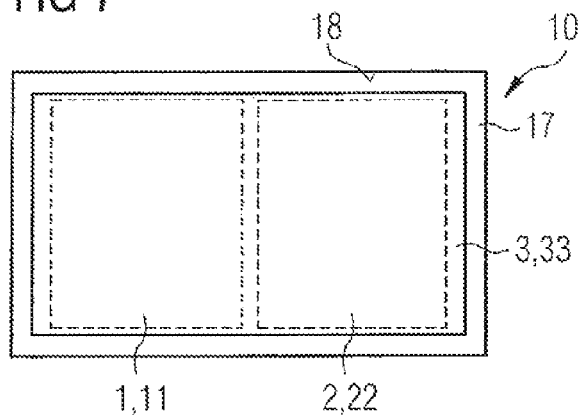

FIG. 7 shows a schematic plan view of the luminous means in equivalence with FIG. 6. The electrical connections and the conductor tracks are not depicted to simplify the illustration.

Figure 8A:
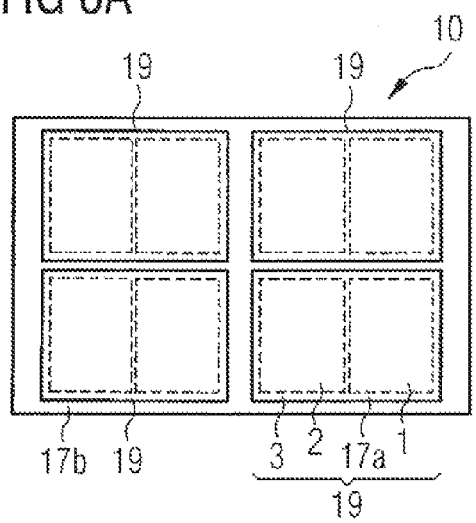
Figure 9A:
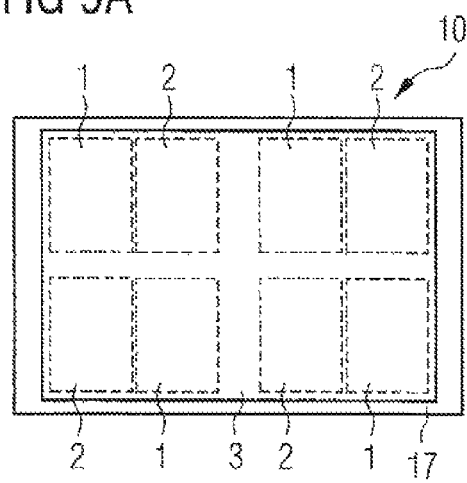
Figure 8B:
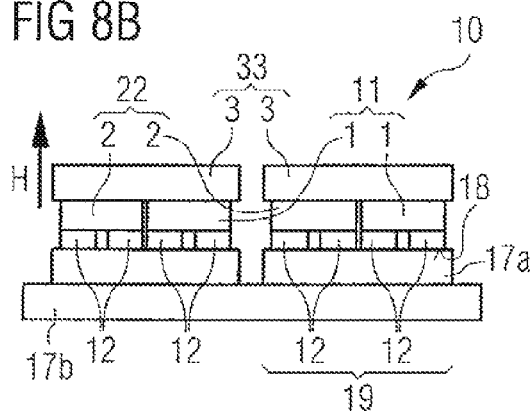

In the example in accordance with FIG. 8, the semiconductor chips 1, 2, 3 are arranged in modules 19. The module 19 is fashioned like the luminous means 10 in accordance with FIG. 4, for example. The module 19 has a carrier 17a, on the carrier top side 18 of which the semiconductor chips 1, 2, 3 are applied. A plurality of modules 19 is then arranged on a common carrier 17b, in an arrangement of two by two modules 19 in accordance with the plan view in FIG. 8A. Within a module 19, a semiconductor chip 1 of the first group 11 and a semiconductor chip 2 of the second group 22 are covered by a single semiconductor chip 3 of the third group 33.

Figure 9B:
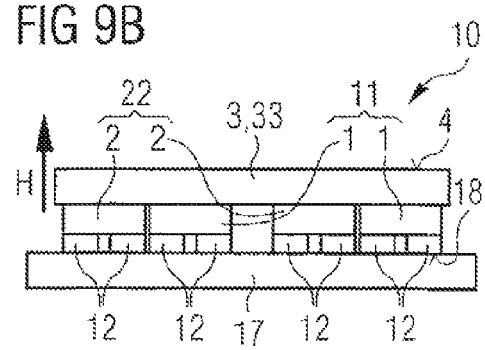

In the example in accordance with FIG. 9, a plurality of semiconductor chips 1 of the first group 11 and a plurality of semiconductor chips 2 of the second group 22 are covered by a single semiconductor chip 3 of the third group 33. A plurality of luminous means 10 in accordance with FIG. 9 can be arranged on a further module carrier (not illustrated). To simplify the illustration, the electrical connections are not depicted, or are only partly depicted, in FIGS. 8 to 14.

In a lateral direction, the semiconductor chip 3, within the scope of the production tolerances, terminates flush with the semiconductor chips 1, 2 lying at the edge of the luminous means 10 in a lateral direction. The semiconductor chips 1, 2 are arranged in such a way that a semiconductor chip 1 of the first group 11 follows a semiconductor chip 2 of the second group 22 in an alternating manner in a lateral direction. The semiconductor chips 1, 2 are arranged in a checkered fashion on the carrier 17 as can be seen in the plan view in FIG. 9A. In other words, a changing sequence of semiconductor chips 1 of the first group 11 and semiconductor chips 2 of the second group 22 is present in both lateral main directions.

Figure 10:
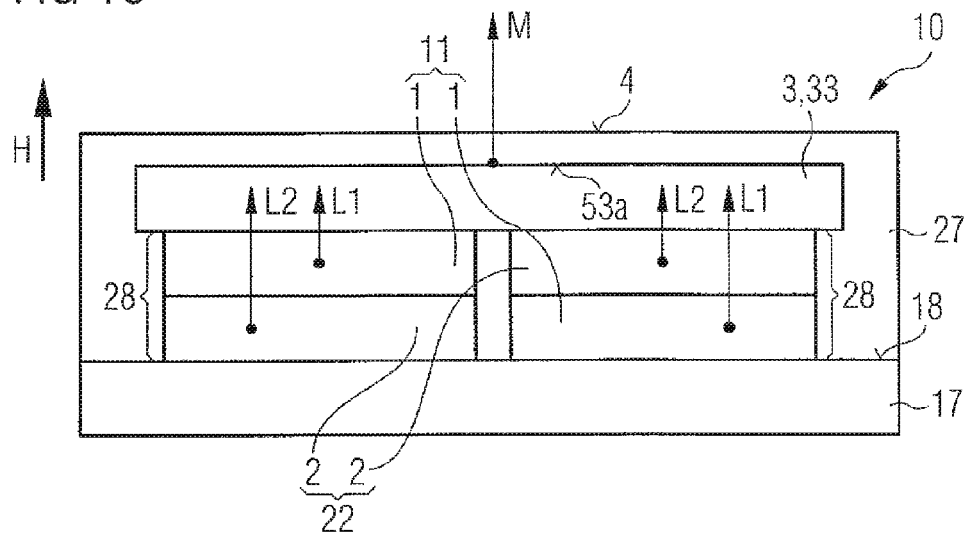

In the example in accordance with FIG. 10, the semiconductor chip 3 of the third group 33 projects beyond the semiconductor chips 1, 2 in a lateral direction. Moreover, the semiconductor chips 1, 2 are arranged in two stacks 28 with respect to the main emission direction H. The stacks 28 are oriented in an alternating manner with respect to the carrier 17 such that in one stack the semiconductor chip 2 faces the carrier top side 18, and in the other stack the semiconductor chip 1 of the first group 11 faces said carrier top side. As a result, the radiation L2 and the radiation L2 are already mixed in the semiconductor chips of the stacks 28 which are remote from the carrier 17. Particularly homogeneous emission over the emission area 4 of the luminous means 10 can be obtained as a result of this.

Optionally, the semiconductor chips 1, 2, 3 are surrounded by an encapsulation 27. The encapsulation 27 can have at the emission area 4 a coating or a structuring, which, for instance, improves the coupling-out of light from the luminous means 10.

Figure 11:
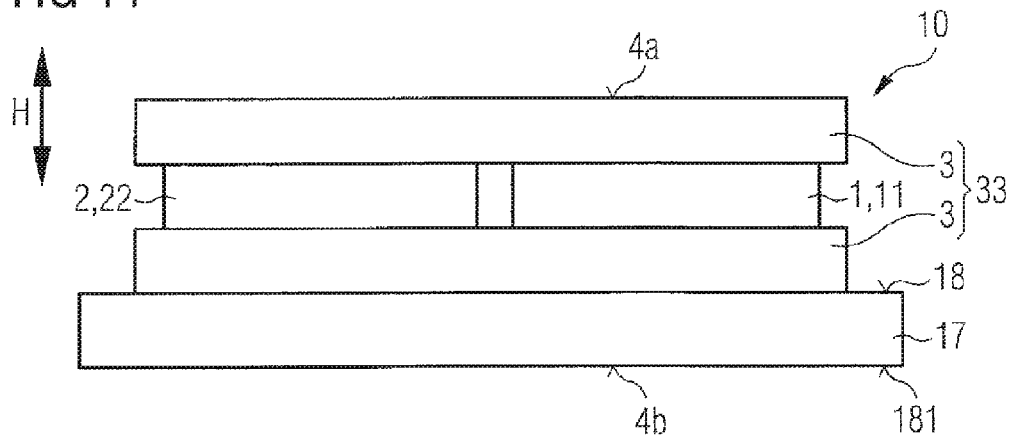

FIG. 11 illustrates a luminous means 10 wherein the semiconductor chips 1, 2 are fitted between two semiconductor chips 3 of the third group 33. The carrier 17 on the carrier top side 18 of which all the semiconductor chips 1, 2, 3 are fitted, is transmissive to the radiation emitted by the semiconductor chips 1, 2, 3. As a result of this, the luminous means 10 has two emission areas 4a, 4b. The emission area 4b is formed by a carrier underside 181 remote from the carrier top side 18. The luminous means 10 therefore has two main emission directions H pointing in opposite directions.

The carrier 17 can be fashioned with a plastic film. If a film is used as carrier 17, the luminous means 10 can be mechanically flexible, that is to say a bending radius of 5 cm or less can be realized without the luminous means 10 being destroyed.

A plurality of the units of semiconductor chips 1, 2, 3 illustrated in FIG. 11 can be fitted on the carrier 17 in one or else in two lateral main directions of the carrier 17, with the result that an areally emitting luminous means 10 can be realized.

FIG. 12 illustrates an optical element 6 such as can be used for example in conjunction with one of the luminous means in accordance with FIGS. 1 to 11. The semiconductor chip 1 of the first group 11 is fitted to an element underside 60. Radiation L 1 coupled into the optical element 6 via the main side 51 is deflected in a direction perpendicular to the main emission direction H by a bevel 62 connecting the element underside 60 to an element top side 61. In other words, the direction of the radiation L1 of the semiconductor chip 1 is rotated substantially by 90° by the optical element 6. The same is correspondingly applicable to a semiconductor chip of the second group, not depicted in FIG. 12. As a result of this, radiation L1 of the first semiconductor chip and of the second semiconductor chip can mix together in the optical element 6. At the element top side 61, therefore, a partial mixed radiation is already present which can be homogeneous with respect to color and intensity over the element top side 61. In the semiconductor chip of the third group that is to be fitted on the element top side 61, not depicted in FIG. 12, further homogenization of the partial mixed radiation and, in addition, mixing with the radiation generated by the semiconductor chip 3 of the third group 33 take place.

In accordance with FIG. 12, the element top side 61 has a smaller area than the element underside 60. The element underside 60 can serve as a mounting area for all the semiconductor chips 1, 2, of the first 11 and second group 22, and the element top side 61 can serve as a mounting area for the at least one semiconductor chip 3 of the third group 33. In this case, the optical element 6 is embodied as a truncated pyramid. The optical element 6 is formed with a glass film, preferably having a thickness of between 30 μm and 300 μm.

Optionally, a coupling medium 24 can be fitted between the semiconductor chip 1 and the optical element 6. The coupling medium 24 can be used to promote adhesion between optical element 6 and semiconductor chip 1. Moreover, the coupling medium 24 can serve for matching the refractive indices of semiconductor chip 1 and optical element 6, thereby ensuring efficient coupling of the radiation L1 into the optical element 6.

FIG. 13 shows a further possibility for the configuration of the optical element 6. At the element underside 60, the optical element 6 has a reflective layer 13*a*, which is fitted in regions in which no semiconductor chips 1, 2 (not depicted in FIG. 13) of the first 11 and of the second group 22 are situated. Furthermore, a roughening 23 is produced at the element underside 60. This roughening can be used to homogenize radiation L1, for example. For deflecting radiation L1, the optical element 6 has the bevels 62. A diffusing plate 21 is fitted to the element top side 61 and serves for further homogenization of the radiation of the semiconductor chips 1, 2 (not depicted). Two prisms films 9*a*, 9*b* which are rotated by 90° relative to one another, are fitted to a main side of the diffusing plate 21 which is remote from the optical element 6.

A further reflective layer 13*b* is disposed downstream of the prism films 9*a*, 9*b* with respect to the main emission direction H. The reflective layer 13*b* can be partly reflective with respect to the radiation from the semiconductor chips 1, 2 situated at the element underside 60. The reflective layer 13*b* can have a reflective effect for radiation L3 generated in the semiconductor chip 3 of the third group 33 to increase the coupling-out efficiency of the radiation L3 from the luminous means 10. In the semiconductor chip 3, further scattering and homogenization of radiations L1, L2 emitted by the semiconductor chips 1, 2 take place, such that the mixed radiation M arises by mixing in the semiconductor chip 3.

Figure 14:
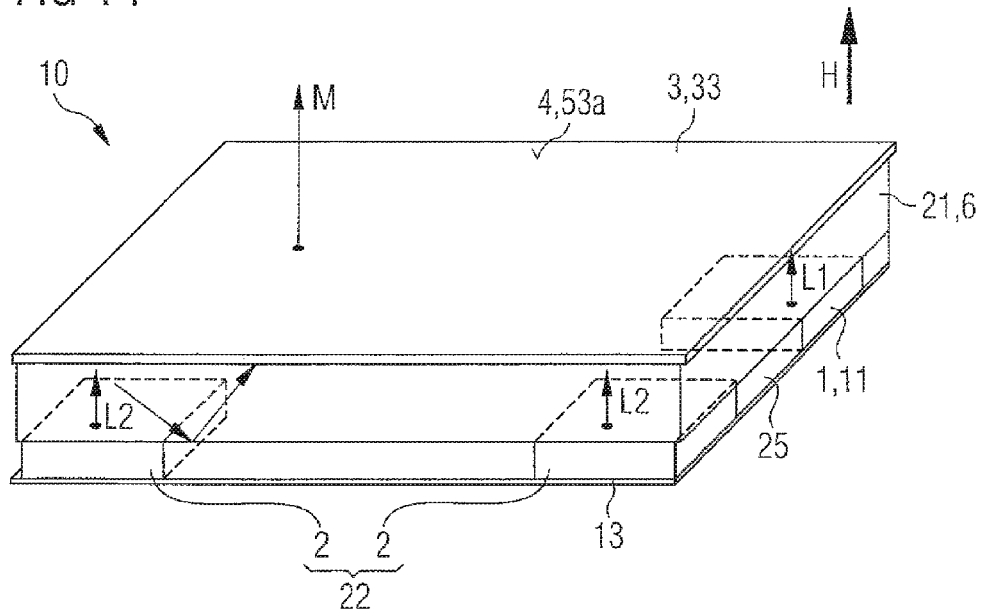

In the example of the luminous means 10 in accordance with FIG. 14, in a schematic three-dimensional illustration, the optical element 6, which is situated between the semiconductor chips 1, 2 of the first 11 and the second group 22 and the semiconductor chip 3 of the third group 33, is simultaneously fashioned as a diffusing plate 21. Consequently, radiations L1, L2 are guided and efficiently homogenized by the optical element 6. The emission area 4 is formed by the main side 53*a* of the semiconductor chip 3. In a direction perpendicular to the main emission direction H, a medium 25 is situated between the semiconductor chips 1, 2. Promotion of adhesion and encapsulation of the semiconductor chips 1, 2 can be effected using said medium 25. The medium 25 is configured such that it is transparent or, preferably, diffusing with respect to radiations L1, L2. The reflective layer 13 is fitted to the sides of the medium 25 and of the semiconductor chips 1, 2 which are remote from the optical element 6, the reflective layer having a reflective effect for radiations L1, L2, L3.

In contrast to the illustration in FIG. 14, it is possible to use a multiplicity of semiconductor chips 1 of the first 11, and semiconductor chips 2 of the second group 22 to obtain a luminous means 10 which emits areally and intensively with a high power.

Figure 15:
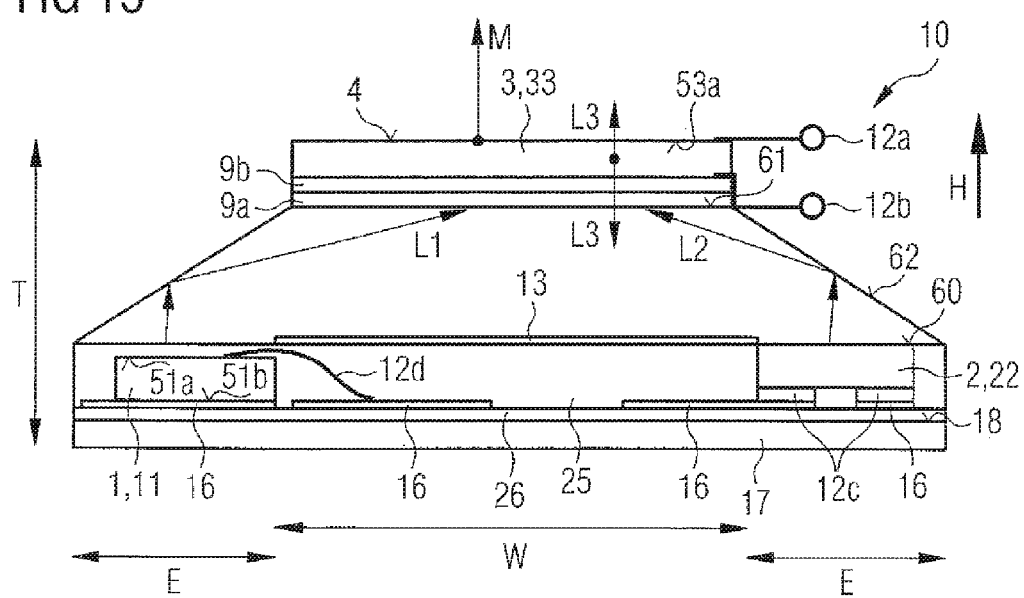

FIG. 15 shows a further example of the luminous means 10. The carrier 17 is fashioned as metallic and has a high thermal conductivity. An insulating layer 26 is applied to the carrier top side 18 by which insulating layer the conductor tracks 16 applied to that side of the insulating layer 26 which is remote from the carrier 17 are electrically insulated from the carrier 17. The semiconductor chips 1, 2 are electrically interconnected by the conductor tracks 16.

The semiconductor chips 2 can be configured as flip-chips, such that contact is made with the semiconductor chip 2 via electrical connections 12*c* which both face the carrier 17. With respect to the semiconductor chip 1, it is shown that the latter has electrical contacts at the main side 51*b* facing the carrier 17 and the main side 51*a* remote from the carrier. The main side 51*a* is electrically connected to the conductor tracks 16 by a bonding wire 12*d*. Electrical contact can also be made with the semiconductor chips 1, 2 in an identical manner, for example, by bonding wires 12*d*. This is the preferred case.

The medium 25 encapsulates and insulates the semiconductor chips 1, 2 and the electrical connections 12*c, d* and also conductor tracks 16. By the medium 25, the semiconductor chips 1, 2 are connected to the optical element 6 having bevels 62. The reflective layer 13 is applied to the element underside 60 in the partial regions in which no semiconductor chips 1, 2 are situated. The two prism films 9*a*, 9*b* are fitted between the element top side 61 and the semiconductor chip 3 of the third group 33. Electrical contact is made with the semiconductor chip 3 via the electrical connections 12*a*, 12*b*.

The semiconductor chip 3 emits radiation L3 on both sides both in a direction away from the optical element 6 and in a direction toward the optical element 6. The conductor tracks 16 have a reflective effect with respect to radiations L1, L2, L3.

The semiconductor chips 1, 2 are situated in the edge regions E in which the optical element 6 has the bevels 62. The edge regions E have an extent of the order of magnitude of 500 μm in a direction perpendicular to the main emission direction H. A central width W, which substantially corresponds to the lateral extent of the element top side 61, is a few cm to a few m. An extent of the medium 25 in the direction of the main emission direction H is approximately 100 μm, and an extent of the optical element 6 and of the prism films 9*a*, 9*b*, of the electrical connections 12*a*, 12*b* and of the semiconductor chip 3 of the third group 33 in the direction of the main emission direction H is approximately 500 μm. Consequently, a vertical extent T of the luminous means 10, in the direction of the main emission direction H, including the carrier 17, is approximately 700 μm. The ratio of central width W and vertical extent T is therefore at least 100, in particular at least 1000. The emission area 4 of the luminous means 10 which is formed by the main side 53a has an area of at least a few cm².

A protective layer, not illustrated in FIG. 15, which protects the semiconductor chip 3 against mechanical loads and ambient influences such as moisture, for example, can optionally be applied to the main area 53a of the semiconductor chip 3. The protective layer can also have an optical effect, for example, as an antireflection layer. It is possible for the carrier 17 to be fashioned as a metal film or foil, with the result that the luminous means 10 is mechanically flexible.

The apparatus and methods described herein are not restricted by the description on the basis of the examples. Rather the apparatus encompasses any novel feature and also any combination of features which in particular includes any combination of features in the appended claims, even if the feature or combination itself does not explicitly specify it in the claims or examples.

The invention claimed is:

1. A luminous means comprising:
   a first group of semiconductor chips and a second group of semiconductor chips, each group comprising at least one semiconductor chip, wherein the first and second groups of semiconductor chips are arranged laterally alongside one another at least in part with respect to a main emission direction of the luminous means, and
   a third group of semiconductor chips which comprises at least one semiconductor chip and is disposed downstream of the first and the second group with respect to the main emission direction,
   wherein
   each group of semiconductor chips emits electromagnetic radiation in wavelength ranges that differ from one another in pairs,
   radiation emitted by the third group of semiconductor chips has the shortest-wave wavelength range,
   radiation emitted by the first and second group of semiconductor chips at least partly passes into the at least one semiconductor chip of the third group, and
   mixed radiation is emitted by an emission area of the luminous means.

2. The luminous means as claimed in claim 1, wherein a main area of the at least one semiconductor chip of the third group is larger than a main area of the at least one semiconductor chip of the first and of the second group.

3. The luminous means as claimed in claim 1, wherein at least one semiconductor chip has a thickness that is less than or equal to 20 μm.

4. The luminous means as claimed in claim 1, wherein each group of semiconductor chips is electrically individually driveable.

5. The luminous means as claimed in claim 1, further comprising at least one prism or truncated pyramid shaped optical element through which optical element radiation emitted by the first or second group at least partly passes to the third group.

6. The luminous means as claimed in claim 1, wherein at least one semiconductor chip of the first and of the second group is fashioned as a flip-chip and wherein at least one semiconductor chip of the third group has electrical contacts on main areas lying opposite one another.

7. The luminous means as claimed in claim 1, wherein the third group comprises at least two semiconductor chips spaced apart from one another in a direction of the main emission direction and span an interspace, in which the semiconductor chips of the first and of the second group are situated.

8. The luminous means as claimed in claim 7, comprising two emission areas that lie on opposite sides of the luminous means, and wherein the luminous means is configured to emit the mixed radiation at the two emission areas.

9. The luminous means as claimed in claim 1, wherein the at least one semiconductor chip of the first and of the second group as viewed in the main emission direction is covered completely by the at least one semiconductor chip of the third group.

10. The luminous means as claimed in claim 1, wherein the radiation emitted by the first and the second group of semiconductor chips partly does not pass through the at least one semiconductor chip of the third group before leaving the luminous means.

11. The luminous means as claimed in claim 1, wherein the first and the second group each comprise at least two semiconductor chips wherein at least one semiconductor chip of the first group and at least one semiconductor chip of the second group are arranged one above another with respect to the main emission direction.

12. The luminous means as claimed in claim 1, wherein at least one semiconductor chip has a prism microstructure.

13. The luminous means as claimed in claim 1, wherein over the entire emission area a color locus of the mixed radiation, with respect to a CIE standard chromaticity diagram, locally deviates from an average value by at most 0.02.

14. The luminous means as claimed in claim 1, which is mechanically flexible is adapted to have a bending radius of $\leq 5$ cm.

15. The luminous means as claimed in claim 5, wherein:
   the emission area is at least 1 cm²,
   the optical element is a plastic and/or glass film and has a reflective layer in places at an element underside remote from the emission area,
   each of the groups of semiconductor chips is electrically individually driveable,
   at least one semiconductor chip of the first and of the second group is fitted to the element underside, and
   at least one prism film is fitted between the at least one semiconductor chip of the third group and the optical element.

* * * * *